(12) United States Patent
Blazic et al.

(10) Patent No.: US 6,744,637 B2
(45) Date of Patent: Jun. 1, 2004

(54) GUIDED MUNITIONS ELECTRONICS PACKAGE AND METHOD

(75) Inventors: Ernest Steven Blazic, Agoura Hills, CA (US); Kent Carl Nelson, Simi Valley, CA (US); Farhad James Nekoogar, Oak Park, CA (US)

(73) Assignee: Alliant Techsystems Inc., Edina, MN (US)

( * ) Notice: Subject to any disclaimer, the term of this patent is extended or adjusted under 35 U.S.C. 154(b) by 0 days.

(21) Appl. No.: 10/307,127

(22) Filed: Nov. 27, 2002

(65) Prior Publication Data

US 2003/0169578 A1 Sep. 11, 2003

Related U.S. Application Data

(60) Provisional application No. 60/338,435, filed on Nov. 30, 2001.

(51) Int. Cl.⁷ ............................. H05K 7/18; H05K 5/00
(52) U.S. Cl. ................. 361/796; 361/752; 361/730; 361/807; 211/41.17; 174/50
(58) Field of Search ....................... 361/728, 729, 361/730, 736, 752, 796, 797, 800, 816, 818, 807; 174/35 R, 35 GC, 35 MS, 50, 50.5, 52.1, 52.3; 211/41.17

(56) References Cited

U.S. PATENT DOCUMENTS

| | | | | |
|---|---|---|---|---|
| 3,008,415 A | * | 11/1961 | Foley | 102/70.2 |
| 3,166,015 A | * | 1/1965 | Tuve et al. | 102/70.2 |
| 3,577,925 A | * | 5/1971 | Schmidt | 102/70.2 |
| 3,596,139 A | * | 7/1971 | Walsh | 317/101 R |
| 3,608,495 A | | 9/1971 | Baltzar | |
| 3,755,717 A | * | 8/1973 | Shaw | 317/101 |
| 3,755,891 A | * | 9/1973 | Muckelroy et al. | 29/628 |
| 4,231,916 A | | 11/1980 | Knappenberger et al. | |
| 4,293,519 A | | 10/1981 | Knappenberger et al. | |
| 4,431,150 A | | 2/1984 | Epperson, Jr. | |
| 4,471,259 A | | 9/1984 | Stoermer et al. | |
| 4,520,428 A | * | 5/1985 | Lusk | 361/399 |
| 4,611,871 A | | 9/1986 | Abt | |
| 4,810,917 A | * | 3/1989 | Kumar et al. | 310/68 |
| 4,891,688 A | | 1/1990 | Longerich | |
| 4,903,603 A | | 2/1990 | Longerich et al. | |
| 4,922,381 A | | 5/1990 | Longerich et al. | |
| 5,117,328 A | | 5/1992 | Bilodeau | |
| 5,325,784 A | | 7/1994 | Bai et al. | |
| 5,372,333 A | | 12/1994 | Uwira et al. | |
| 5,499,164 A | * | 3/1996 | Hill-Lindsay et al. | 361/785 |
| 5,546,804 A | * | 8/1996 | Johnson et al. | 73/431 |
| 5,621,617 A | * | 4/1997 | Goss et al. | 361/721 |
| 5,969,953 A | * | 10/1999 | Purdom et al. | 361/790 |
| 6,137,171 A | * | 10/2000 | Joshi | 257/723 |
| 6,311,621 B1 | * | 11/2001 | Marshall et al. | 102/202.5 |
| 6,366,464 B1 | * | 4/2002 | Cosley et al. | 361/752 |
| 6,404,637 B2 | * | 6/2002 | Hutchison et al. | 361/704 |
| 6,477,035 B1 | * | 11/2002 | Cepas et al. | 361/306.3 |

OTHER PUBLICATIONS

Epure, Deceased et al., United States Statutory Invention Registration, Reg. No. H307, published Jul. 7, 1987, p. 1–4, United States Patent Office, USA.

Griswold et al., United States Statutory Invention Registration, Reg. No. H1245, published Oct. 5, 1993, p. 1–6, United States Patent Office, USA.

Bai, Monty W., European Patent Application, Application No. 93120275.8, published Oct. 8, 1994, p. 1–10, European Patent Office, Europe.

\* cited by examiner

*Primary Examiner*—Michael Sherry
*Assistant Examiner*—Dameon E. Levi
(74) *Attorney, Agent, or Firm*—Michael Blaine Brooks, P.C.; Michael Blaine Brooks

(57) ABSTRACT

A method and system for packaging electronics with an electronic card rack of radial panels, an outer casing, a stabilizing ring, and a flex-circuit interconnect, whereby electronic cards inserted into the sectors formed by the radial panels do not carry the structural load. The card-mounted devices are optimally oriented for set back forces, and minimal potting and/or structural foam is required, if any. The present invention provides a lightweight, highly serviceable assembly that is relatively less expensive to produce, test and rework compared with potted assemblies.

75 Claims, 5 Drawing Sheets

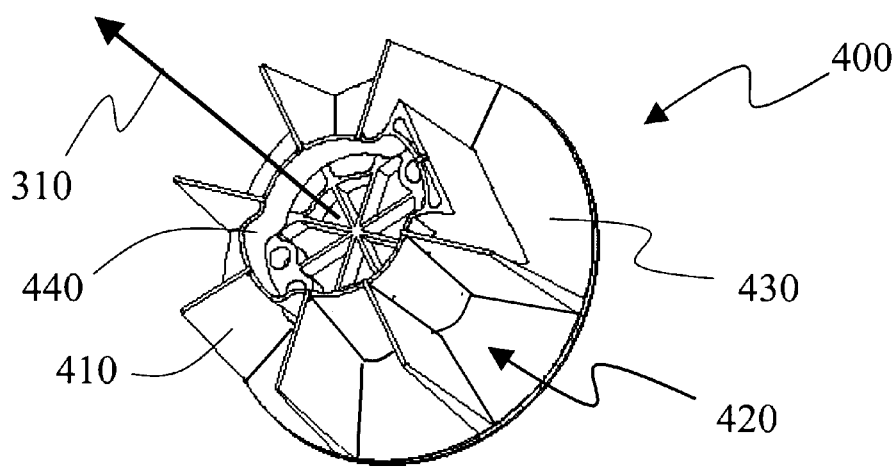
FIG. 4
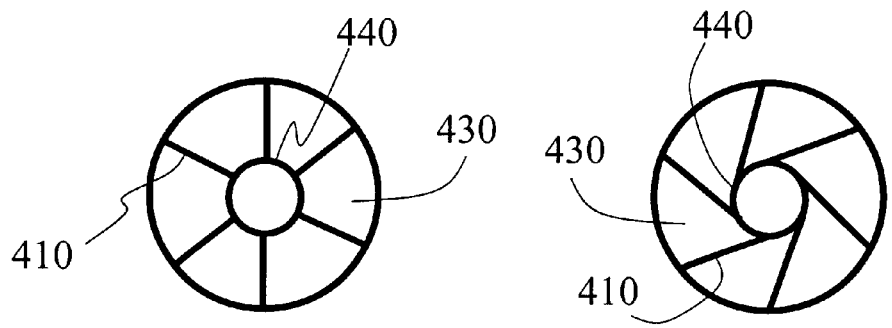
FIG. 5A  FIG. 5B
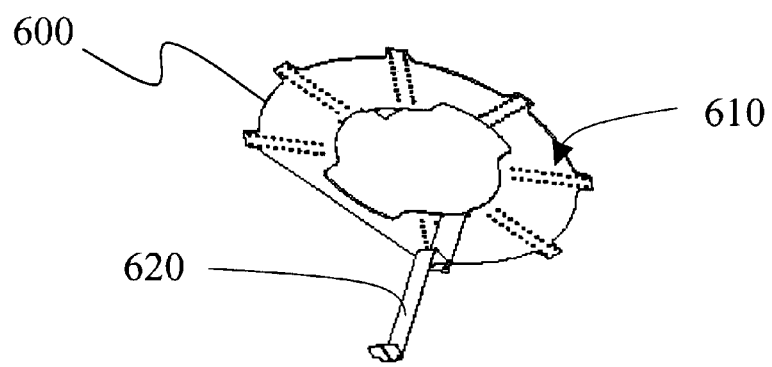
FIG. 6

GUIDED MUNITIONS ELECTRONICS PACKAGE AND METHOD

CROSS REFERENCE TO RELATED APPLICATIONS

This application claims priority from the following U.S. Provisional Patent Application, the disclosure of which, including all appendices and all attached documents, is hereby incorporated herein by reference in its entirety for all purposes: U.S. Provisional Patent Application Ser. No. 60/338,435 of Ernest Steven Blazic, Kent Carl Nelson, and Farhad James Nekoogar entitled, "GUIDED MUNITIONS ELECTRONICS PACKAGE AND METHOD," filed Nov. 30, 2001.

FIELD OF THE INVENTION

This invention relates to housing and mounting assemblies for electronic systems and devices and methods of packaging thereof and more particularly to the packaging and assemblies of electronics of systems operable in environments subject to accelerations several thousands times that of gravity.

BACKGROUND OF THE INVENTION

Guidance electronics for gun-launched vehicles must endure some of the most demanding environments of all flight vehicle avionics. The set back forces, balloting and spin rates are typically far beyond those experienced by tactical and in many cases strategic missiles. The structural support for the guidance electronics is unsurprisingly challenging. The practice of the prior art in guided munitions typically employs a parasitically complicated structural support for the electronics packaging. In many instances, the structural supports are inadequate, leaving the circuits assemblies to rely upon potting material encapsulation and/or structural foams in order to protect the circuitry from the gun-launched, high-g, environment.

Unfortunately, the potting material is difficult to apply and control in production. The coefficient of thermal expansion (CTE) mismatch, contributes to failures related to temperature cycling. Potted electronics assemblies and structural foams are problematic where rework or repair is required. In addition, the circuit card form factor of many guided munitions is driven by the orientation and location of the electronics packaging within the aerodynamic shell, often resulting irregular, or at least in nonrectangular, planforms that do not readily lend themselves to high volume, low cost production.

Electronic packaging considerations for gun-launched guided munitions must include the survivability of each circuit card assembly and its interconnection with the rest of the electronic assembly. For comparison, tactical missile circuit card assemblies and interconnects may be designed to withstand 30 g acceleration, whereas a gun-launched electronics assembly will typically be designed to withstand up to 20,000 g acceleration. A typical practice in the art of gun-launch survivability has circuit card assemblies made substantially rigid with metal or, as discussed above, fully encapsulated in potting materials and/or structural foam.

Adding to the complicating challenges, some components, such as a crystal oscillator, require a specific orientation with respect to the setback forces generated during a gun launch. Board level interconnects (e.g., wire bonds, gull wing leads, solder balls, and similar electrical connections), die attachment means (e.g., adhesive or solder) and component package styles (e.g., bare die, small outline surface mount packages and the like) must be tailored to accommodate the high setback forces.

Circuit card assembly costs are another important aspect of this art because gun-hardened electronics designs experience considerably higher production volumes as compared to relatively limited volumes of tactical missile electronics produced over the life cycle of the avionics in question.

OBJECT AND ADVANTAGES

A principal object of this invention is to provide circuit card technology that is capable of surviving a gun-launch environment (including setback, spin rate and balloting) such as that from a 155 mm canon by substantially isolating the electronic subsystems from nose and canard loading. That is, an object is to environmentally protect the electronic assembly by completely supporting single-sided circuit cards where the circuit cards are not structural elements and concurrently provide a relatively large area for heat dissipation. An additional object is to provide guided munitions electronic packaging and packages that are easier and less expensive to produce compared to the prior art. An additional object is to minimize the number of electrical interconnections (e.g., solder joints and mechanical connectors) and thereby reduce the number of failure points and streamline the manufacturing process. An additional object of the present invention is to minimize the use of potting materials, if any, and thereby obviate the need for structural foam. An additional object is to exploit the use of commercial off-the-shelf devices wherever practicable. An additional object of the present invention is to maximize the testability to efficiently support a streamlined manufacturing process. An additional object of the present invention is to isolate the electronic subsystems from aerodynamic and thermal battery heat loads.

SUMMARY

The card rack and stabilizer structure of the several embodiments of the present invention comprise high strength titanium beta alloy, hot isostatic processing (HIP) eliminating voids and assuring uniform properties, structural support elements integrated into a monocoque structure, whereby the radial rib design provides structural rigidity and maximizes the circuit card assembly thermal heat transfer area.

BRIEF DESCRIPTION OF THE DRAWINGS

The present invention is illustrated by way of example and not limitation in the figures of the accompanying drawings, and in which:

FIG. 4 is a perspective view of a card rack embodiment of the present invention;

FIG. 5A is an example panel radiating pattern for a card rack embodiment of the present invention;

FIG. 5B is an example panel radiating pattern for a card rack embodiment of the present invention;

FIG. 6 is a perspective view of a flex circuit embodiment of the present invention;

DETAILED DESCRIPTION OF THE INVENTION

Figure 1:
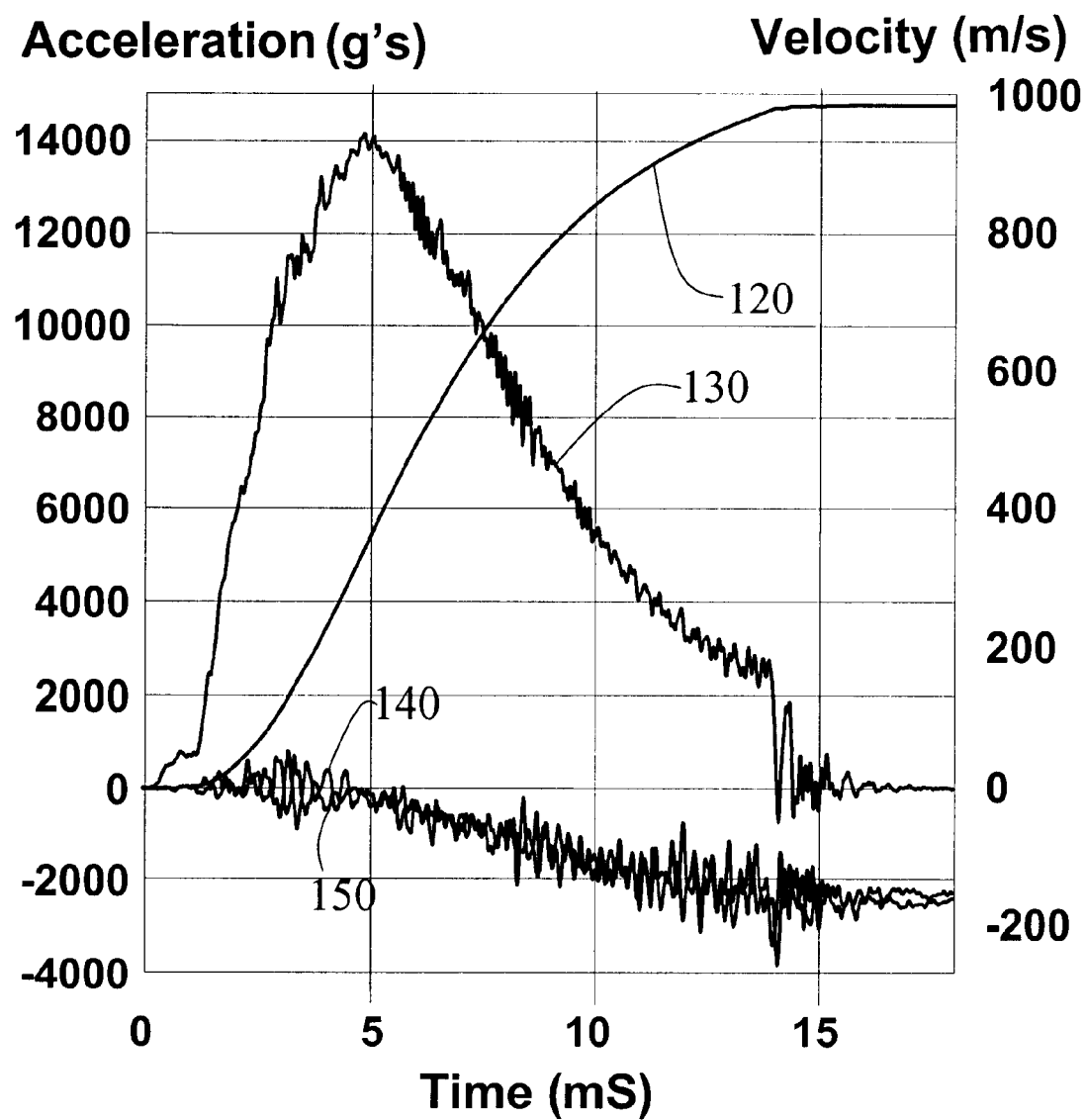
FIG. 1 is a graph of a sample acceleration and velocity profile of the gun-launched environment.

The present invention addresses the electronic assembly interconnections as part of the overall gun-hardened electronic packaging. The FIG. 1 depicts a high-g event for a modern cannon shell where the resulting environmental effects provide a satisfactory example of a typical gun-launched environment for guidance electronics. In this example, the projectile is despun from the typical 300 revolutions per second of a 155 mm cannon to around 30 revolutions per second. Electronic assembly interconnections between the guidance, navigation and control (GNC) processor circuits and other circuit card assemblies cannot be made using the connectors that are typical of tactical missiles.

Figure 2:
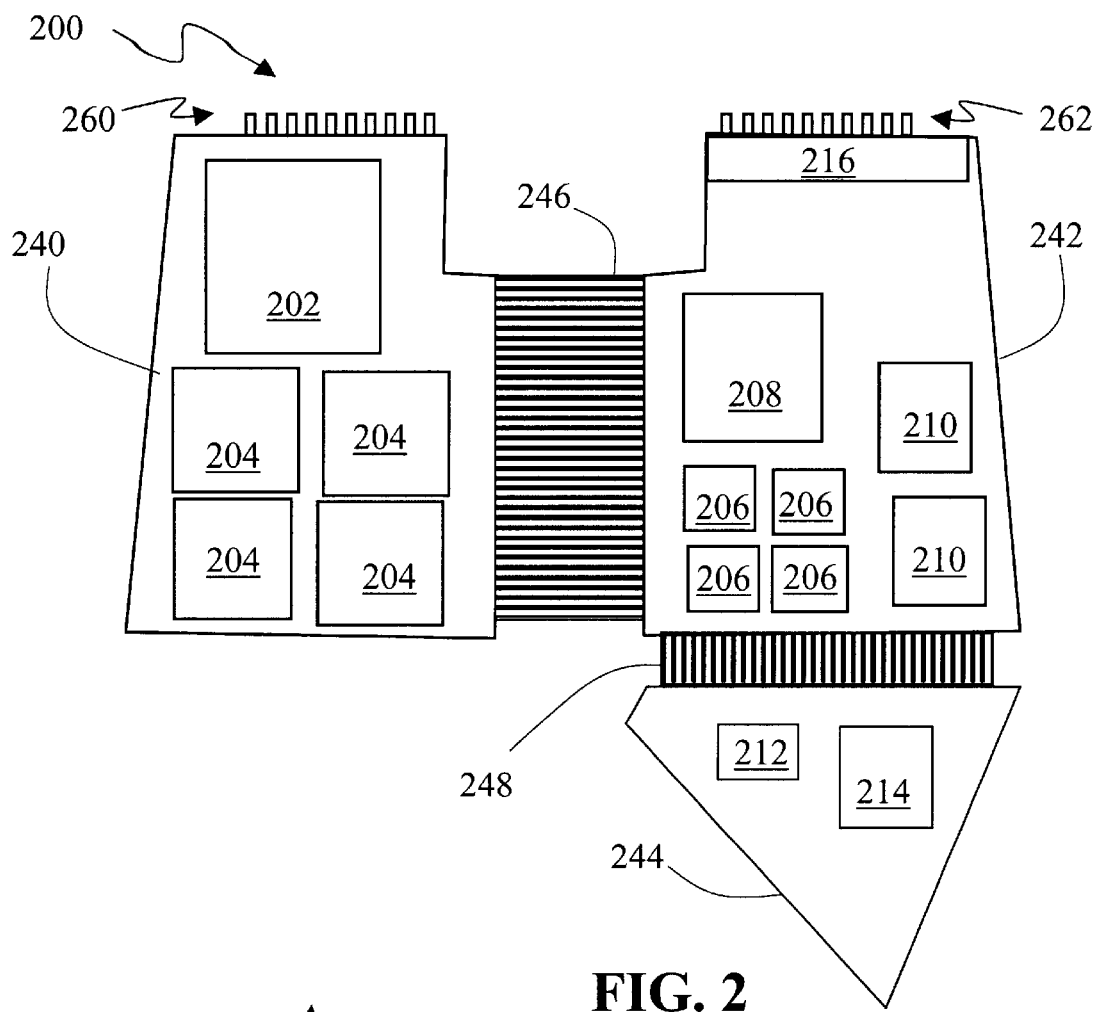
FIG. 2 is an example layout of a circuit card assembly of the present invention.

FIG. 2 illustrates a circuit card assembly 200 of an embodiment of the present invention including three sections integrated via rigid flexible ribbon. The first section 240 and second section 242 are in electrical communication via a first flexible ribbon 246. The second section 242 and third section 244 are in electrical communication via a second flexible ribbon 248. The example GNC processor located on this example circuit card assembly is comprised of the following devices: (1) a microprocessor chip 202; (2) a plurality of static random access memory (SRAM) chips 204; (3) a plurality of flash programmable read only memory (FPROM) chips 206; (4) a programmable logic chip 208; (5) a plurality of universal asynchronous receiver/transmitter (UART) chips 210; (6) a crystal oscillator 212 with a clock buffer 214; and (7) an input/output (I/O) interfacing element 216. A first plurality of connector pins 260 is provided along the upper edge of the first section 240 and a second plurality of connector pins 262 is provided along the upper edge of the second section 242.

The example g-hardened GNC processor circuit incorporates all components that are needed to support GNC processing calculations. The example electronic assembly has a power supply circuit card assembly to condition and otherwise regulate the voltage forms (e.g., 5 and 12 volts) generated by the flight thermal battery after gun launch. The power supply for this example provides the necessary power forms (e.g., 3 and 5 volts) to the GNC processor circuit card assembly. The GNC processor circuit for this example is specified to use a maximum of 8 Watts of power and fit within 5 cm×8 cm×1 cm envelope. The GNC processor in this example is not required to operate during the high-g event, but must remain functional.

Other than requisite conformal coatings, electronics survival in the high-g (acceleration) environment is accomplished without potting and/or structural foam augmentations. In addition, by practicing the teachings of the several embodiments of the present invention, no secondary processes are required for the sealing of the undersides of parts generally subject to potting.

Modularity of the present invention lends itself to efficient subassembly testing, test survivability, and accordingly provides for high manufacturing yields. Modularity without potting also provides for the ready connectivity to external sources via a plug or port. Part of this high yield is accomplished by the elimination of a potting process that is difficult to control. Elimination of the potting material also contributes to a comparative reduction of failures related to the coefficient of thermal expansion (CTE).

Single-sided passive elements may be surface-mounted components on the multi-layer polyimide rigid-flex circuit 200. Alternative embodiments have epoxy laminates for the circuit cards 200. Other embodiments have ceramic circuit cards 200. The several embodiments of the present invention have the circuit cards 200 completely bonded to the card rack 400 and accordingly the circuit cards do not carry substantial g-loads. Moreover, the thermally conductive adhesive may be employed to enhance the thermal path. Finally, the several embodiments of the present invention do not require potting separately or in combination with structural foam to support cards assemblies under gun-launched setback forces and other forces experienced within a gun barrel.

The circuit card 200 orientation of the several embodiments of the present invention have the setback force from a gun launch acting in parallel to the circuit card plane. This orientation lends itself to rectangular circuit card geometry that results in an optimal utilization of the circuit card materials and more efficient circuit assembly. An alternative circuit card orientation results in toroidal, donut-shaped, or disc-shaped geometry that is known to be relatively more expensive to produce as well as disc-shaped cards.

Figure 3A:
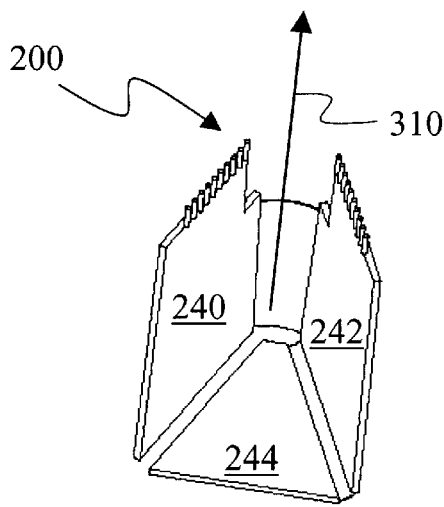
FIG. 3A is a perspective view of a circuit card assembly of the present invention.
Figure 3B:
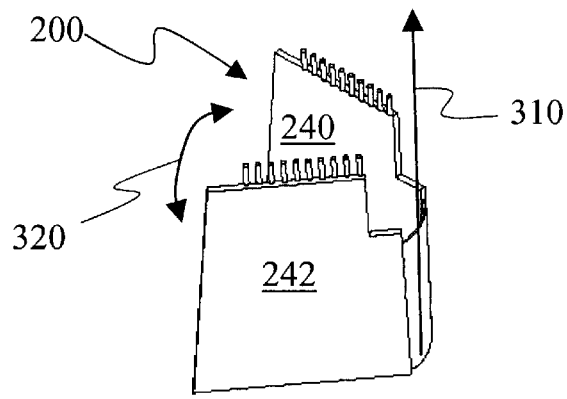
FIG. 3B is a perspective view of a circuit card assembly of the present invention.

FIG. 3A illustrates in a perspective view the orientation of the card assembly 200. The first section 240 and the second section 242 are oriented in planes parallel with the gun setback force vector 310. The third section 244, when installed, is oriented in a plane perpendicular to the setback force vector 310 and is therefore ideally suited for supporting an crystal oscillator 212. FIG. 3B illustrates in a perspective view the acute angle formed between the first section 240 and the second section 242.

FIG. 4 illustrates in perspective view of an example cast card assembly rack 400. The card assembly rack 400 is preferably a cast member and functionally has a base 430 perpendicular to the setback force vector 310, fins 410 parallel to the setback force vector 310 and a substantially cylindrical portion 440 projecting from the base 430 and from which the fins 410 radiate. FIG. 5A illustrates an example fin radiation pattern for the card assembly rack as viewed from the top with each fin 410 perpendicular to the local tangent of the cylindrical portion 440. FIG. 5B illustrates an alternative fin radiation pattern for the card assembly rack as viewed from the top with the fins 410 radiating parallel to the local tangent of the cylindrical portion 440. In alternative embodiments, the card rack 400, as a cast piece, has one or more removable planar spokes with or without dovetailing features in order to support special circuit cards. The orientation of panel spokes or fins 410, their number and the diameter of the hub aperture 440 are all adjustable for particular applications. While the card rack 400 is preferably cast, alternative embodiments have it fabricated by machining.

FIG. 6 illustrates in perspective view a flex circuit interconnect 600 connected to the card rack via a connector strip 620. The flex circuit 600 provides electrical connectivity across the several circuit cards 200 (FIG. 2) via receptacles 610. In alternative embodiments, the electronic assembly interconnect 600 may use a rigid or flex printed circuit that is hard-wired or soldered to the GNC processor circuit card assembly. An alternative embodiment of the electronic assembly uses connectors. If electronic assembly interconnections are hard-wired or soldered to each circuit card assembly then rework is made more difficult, but not impossible.

Figure 7:
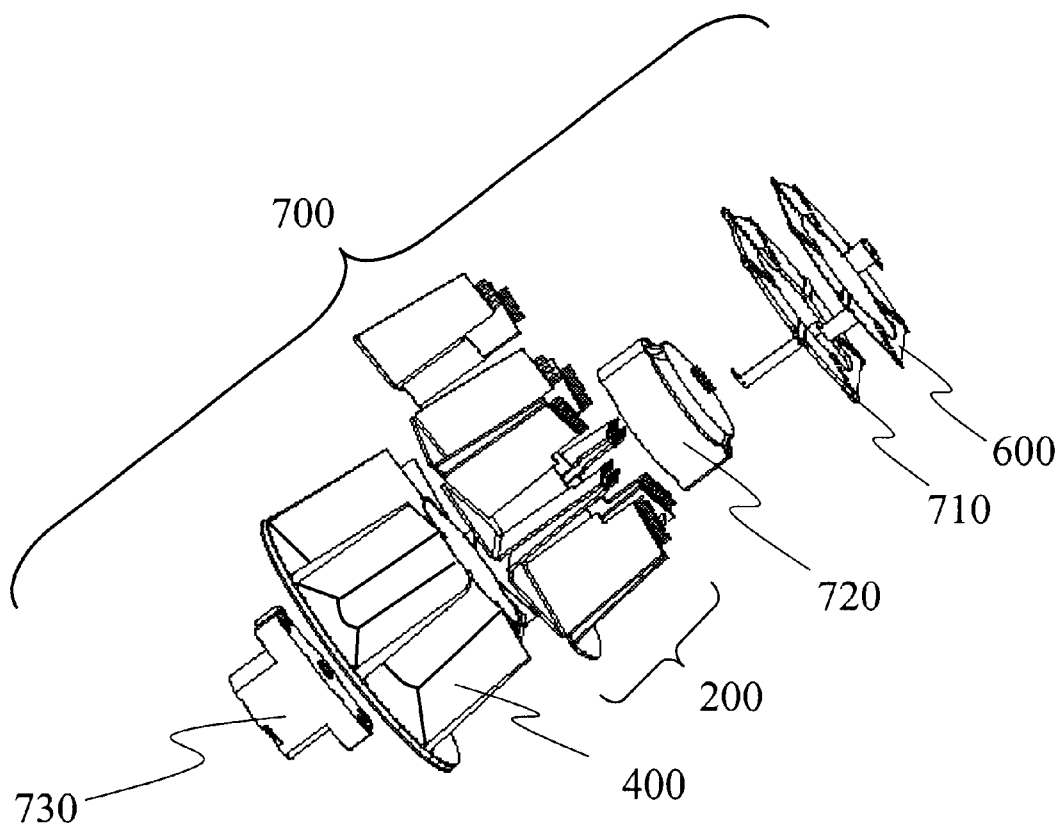
FIG. 7 is an exploded view of a card rack assembly embodiment of the present invention.
Figure 8:
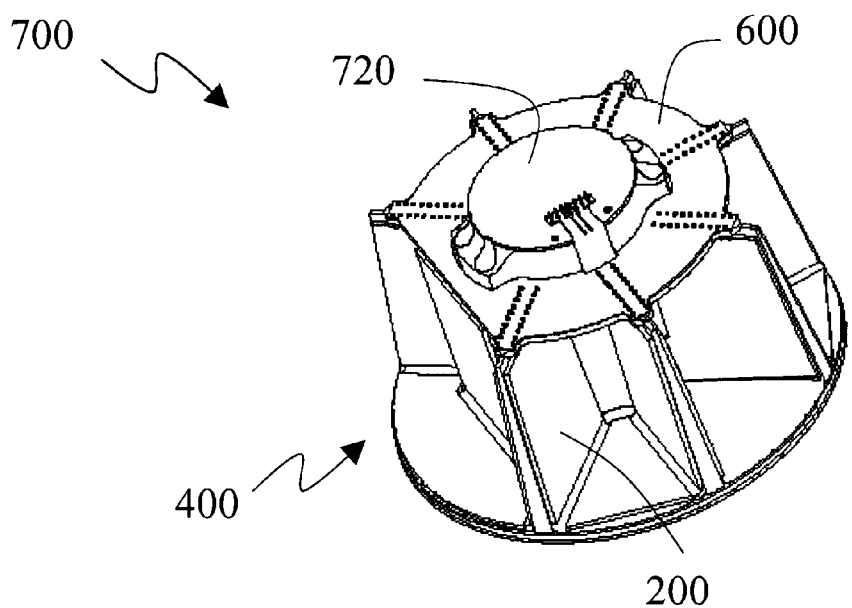
FIG. 8 is a perspective view of a card rack assembly embodiment of the present invention.

FIG. 7 illustrates in exploded view a portion of an example payload assembly 700 including the flex circuit 600, a stabilizing member 710, an inertial measurement unit (IMU) 720, a plurality of card assemblies 200, a card assembly rack 400, and a safe-arming unit (SAU) 730. The stabilizing member 710 is patterned substantially after the flex circuit 600 in planform and provides a stabilizing mechanical interface for receiving circuit card connector pins between the circuit cards 200 and the flex circuit 600. FIG. 8 illustrates in a perspective view the example payload assembly 700 showing the flex circuit 600, IMU 720, and plurality of card assemblies 200 assembled onto the card assembly rack 400. FIG. 8 illustrates the circuit card assemblies 200 bonded to the card rack 400. The stabilizer 710 is bonded to the card rack 400 for added support. The preferred embodiments uses all solder joint terminations. That is, no connectors are used.

Figure 9:
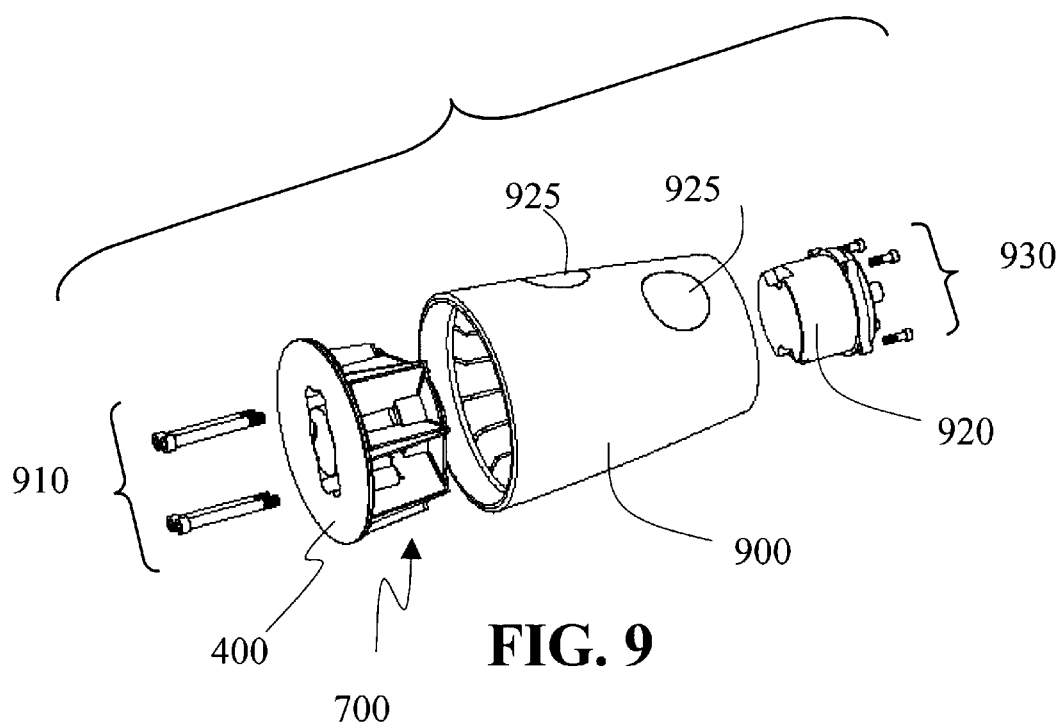
FIG. 9 is an exploded view of a card rack assembly and outer casing embodiment of the present invention.
Figures 10, 11:
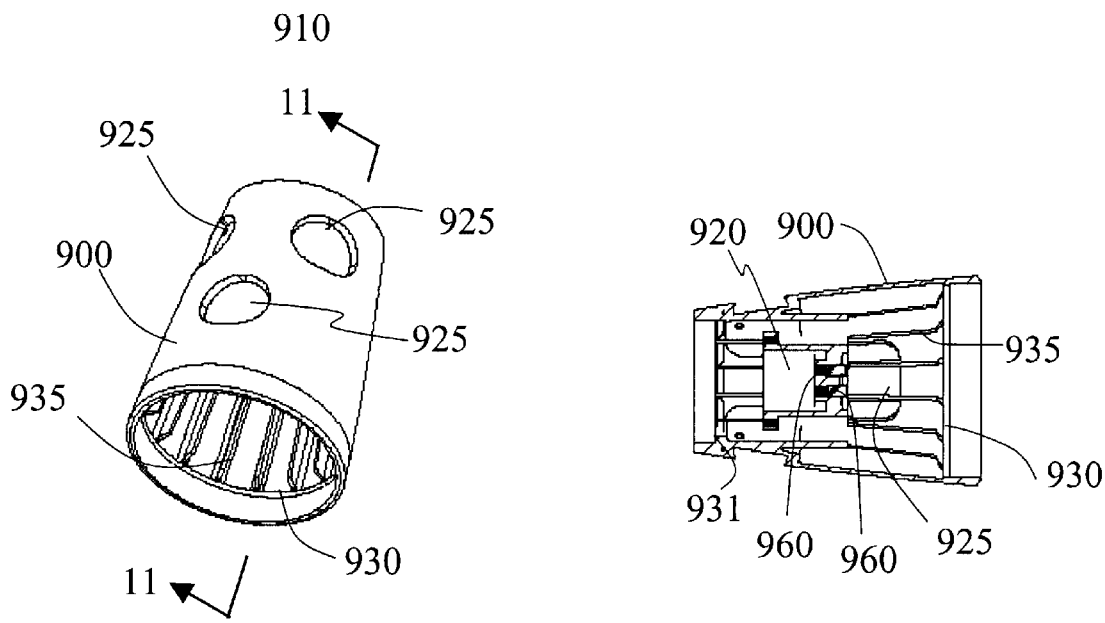
FIG. 10 is a perspective view of an outer casing embodiment of the present invention.
FIG. 11 is a cross-sectional view of an outer casing embodiment of the present invention.

An embodiment of the present invention illustrated in FIG. 9 has a two-piece metallic structure comprised of a cast outer shell 900 and the card rack 400 whereby the structure supports all the electronic subsystems as a portion of the payload 700. The example cast outer shell 900 is shown with a plurality of antenna apertures 925. An example of a cast outer shell 900 is shown in perspective view in FIG. 10. The cast outer shell 900 is reinforced with several cast ribs 935. The cast outer shell 900 shown in cross-sectional view in FIG. 11 is also reinforced with bulkhead features 930, 931. For embodiments using alignment bushings 960, they are positioned in the outer casing 900 portion for receiving the fasteners 910. The reinforcing features support the prepackaged electronic subsystems, e.g., battery 920 attached with fasteners 930 (FIG. 9), IMU 720 (FIG. 7), SAU 730 (FIG. 7), and antennas (not shown). The card rack 400 is a cast structure that preferably holds all the circuit card assemblies, e.g., GNC, Global Positioning Satellite (GPS) navigational receiver (not shown), and a power supply (not shown) and in alternative embodiments contains a prepackaged electronic subsystem as well, e.g., battery, IMU 720, and SAU 730. The example illustrated in FIG. 9, the card rack 400 and outer shell are mechanically fastened together with four fasteners 910, preferably steel bolts, in tension that hold the two structures tightly together. In alternative embodiments, the card rack 400 and outer shell 900 are mechanically fused together with alignment bushings 960 and fasteners 910, preferably steel bolts, in tension that hold the two structures tightly together. The alignment bushing 960 engage the fasteners 910 and in doing so align the card rack 400 to the outer shell 900. The bushings are preferably cast or machined steel. The resulting structure is sufficiently stiff and stable providing ample support for the circuit card assemblies 200 and the other prepackaged electronic subsystems. The circuit assemblies 200 are bonded or alternatively fastened, or bonded and fastened, to the card rack structure 400. Embodiments of the present invention have the card rack-mounted circuitry 200 employing edge-mounted pins 262 for power/signal interconnect that protrude through copper plated vias in the flex or rigid-flex circuit interconnect 600. This entire card rack assembly 700 may be passed through a wave solder operation to make all card-to-card interconnections without using mating connectors. Connectors may be used if so desired in alternative embodiments, but the use of connectors adds assembly costs and works to diminish system reliability. While soldering is the preferred means for electrically connecting electrical components, alternative embodiments have connectors built into the multiple-part or single-part flex circuit. While multi-layered flex 600 is the preferred medium of connectivity, alternative embodiments use multi-piece flex or rigid flex as the medium of connectivity. In typical implementations of the several embodiments of the present invention, the bulkhead is welded onto the aft bulkhead or otherwise sealed. A stabilizer 710 may also be employed to provide additional support for the card rack and rigid-flex or flex circuit interconnect. In alternative embodiments, the stabilizer 710 is increased in size and circumferential capacity over the preferred embodiment and is used to encase the entire unit, particularly for environments of less acceleration than those illustrated in FIG. 1.

The first section 240 and second section 242 planform for several embodiments of the present invention is rectangular, and for the example embodiment is approximately 2.5 inches by 2 inches in planform. In alternative embodiments, individual circuit cards assemblies 200 for the invention may be interconnected using a rigid flex circuit to form a larger folded circuit. The several embodiments of present invention also lend themselves to in-plane or normal loading of the circuit card assembly depending on which face of the card rack that the circuit card is attached. The simplicity of the two piece structure that make up the structural design of the invention also lends itself to low cost, high volume fabrication. The two parts, the card rack and aft bulkhead are castable to the required shapes with minimal machining required. The way in which the card rack 400 and aft bulkhead 420 are combined into one part tends to reduce part count and weight. The outer shell 900 also incorporates inner bulkheads 935 to support the packaged electronic subassemblies and card rack, and this integrated structural design approach tends to reduce part count and weight. The four bolts 910 and features 930, 931 holding and aligning the card rack assembly 700 and, if present, the SAU 730, to the outer shell 900 couples the two structures tightly together and also makes for minimal structural mass. The use of a wave solder or equivalent process to interconnect all the card rack mounted circuit card assemblies improves over typical processes in that interconnecting the circuit card assemblies with a wave solder process or equivalent process has significant cost, weight and reliability advantages over the use of connectors.

Titanium is the preferred material from which the two-piece housing of the several embodiments of the present invention is made, with stainless steel being an alternative material. In addition, the present invention naturally lends itself to electromagnetic interference (EMI) shielding. The card rack 400 and stabilizer structure 710 of the several embodiments of the present invention are made of high strength titanium beta alloy with hot isostatic processing (HIP) eliminating voids and assuring uniform properties. Structural support elements 935 are integrated into the monocoque structure of the casing 900, whereby the radial rib design of the card rack 400 provides structural rigidity and maximizes the circuit card assembly 200 thermal heat transfer area. The method of wave solder or equivalent provides a one-shot production step with a safe and arming unit 730, if needed, assembled after curing. In addition, passive components may be bonded to the forward or outward face of the flexure 600 prior to wave solder.

Many alterations and modifications may be made by those having ordinary skill in the art without departing from the spirit and scope of the invention and its several embodiments disclosed herein. Therefore, it must be understood that the illustrated embodiments have been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

What is claimed is:

1. A system for packing electronics exposed to a gun-launched environment comprising:
    a card rack comprising:
        a base portion having an upper side, a lower side, an edge and a center axis;
        a wall portion extending from the base portion and having a principal axis substantially aligned with the base center axis and substantially perpendicular to the upper side of the base, wherein the wall portion has an inward side facing the principal axis, an outward side facing away from the principal axis and a top edge;
        and a plurality of panel portions, each of the plurality of panel portions extending from the base portion and having a top side, a negative rotation facing side, a positive rotation facing side and an outer edge, each of the top sides of the plurality of panel portions oriented radially from the principal axis of the wall portion and thereby extending outwardly from the outward side of the wall portion;
        and a plurality of mounting sectors wherein any two adjacent panel portions of the plurality of radially oriented panel portions, an interstitial sector of the upper side of the base, and an interstitial portion of the outward side of the wall portion form a mounting sector;
    at least one circuit card assembly having a top edge, the at least one circuit card mechanically inserted into a respective mounting sector of the plurality of mounting sectors of the card rack; and
    a circuit interconnect member in electrical communication with the inserted at least one circuit card assembly, the circuit interconnect member mounted to the top side of each of the plurality of panels.

2. The system as claimed in claim 1 wherein the at least one circuit assembly is bonded to the card rack.

3. The system as claimed in claim 1 wherein the at least one circuit assembly mechanically inserted into a respective mounting sector comprises a first card bonded to a negative rotation facing side of a panel portion, a second card bonded to a positive rotation facing side of an adjacent panel portion, wherein the first card and second card are interconnected via flex ribbon.

4. The system as claimed in claim 3 wherein the at least one circuit assembly mechanically inserted into a respective mounting sector further comprises a third panel, bonded to the interstitial sector of the upper side of the base, wherein the third card is interconnected via a flex ribbon to the second card.

5. The system as claimed in claim 3 wherein the at least one circuit assembly mechanically inserted into a respective mounting sector further comprises a third panel, bonded to the interstitial sector of the upper side of the base, wherein the third card is interconnected via a flex ribbon to the first card.

6. The system as claimed in claim 1 wherein the base portion has a disc shape.

7. The system as claimed in claim 1 wherein the lower side of the base portion has a central aperture for receiving a recessable aft member.

8. The system as claimed in claim 7 wherein the recessable aft member is a safe and arming device.

9. The system as claimed in claim 1 wherein the wall portion is substantially cylindrical.

10. The system as claimed in claim 1 wherein the circuit interconnect member has a disc shape.

11. The system as claimed in claim 10 wherein the circuit interconnect member has a central aperture for receiving a recessable forward member.

12. The system as claimed in claim 11 wherein the recessable forward member is an inertial measurement unit.

13. The system as claimed in claim 1 further comprising a stabilizing member for mechanically stabilizing the inserted at least one circuit card assembly.

14. The system as claimed in claim 13 wherein the stabilizing member has a disc shape.

15. The system as claimed in claim 14 wherein the stabilizing member has a central aperture for receiving a recessable forward member.

16. The system as claimed in claim 15 wherein the recessable forward member is an inertial measurement unit.

17. The system as claimed in claim 1 wherein each of the at least one circuit card assembly has a plurality of connector pins.

18. The system as claimed in claim 17 wherein the circuit interconnect member has a plurality of apertures in at least one radial linear array for receiving the polarity of circuit card connector pins.

19. The system as claimed in claim 1 wherein the at least one circuit card assembly comprises at least one multi-layer polyimide circuit card.

20. The system as claimed in claim 1 wherein the at least one circuit card assembly comprises a plurality of multi-layer polyimide circuit cards interconnected with flex ribbon.

21. The system as claimed in claim 1 wherein the at least one circuit card assembly comprises at least one multi-layer circuit card of epoxy laminates.

22. The system as claimed in claim 1 wherein the at least one circuit card assembly comprises a plurality of multi-layer circuit cards of epoxy laminates interconnected with flex ribbon.

23. The system as claimed in claim 1 wherein the at least one circuit card assembly comprises at least one multi-layer ceramic circuit card.

24. The system as claimed in claim 1 wherein the at least one circuit card assembly comprises a plurality of multi-layer ceramic circuit cards interconnected with flex ribbon.

25. The system as claimed in claim 1 wherein the electrical interconnections of the system are wave soldered.

26. The system as claimed in claim 1 wherein the electrical interconnections of the system are made with connectors.

27. The system as claimed in claim 1 further comprising:
at least one outer case fastener and
an outer casing, having a plurality of internal ribs aligned with the plurality of panel portions of the card rack, the outer casing fastened to the card rack with at least one outer case fastener.

28. The system as claimed in claim 27 wherein the outer casing is welded to the card rack.

29. The system as claimed in claim 27 wherein the outer casing is a shell casing.

30. The system as claimed in claim 27 wherein the outer casing is a shell casing in the shape of a frustro-conical section.

31. The system as claimed in claim 27 further comprising at least one alignment bushing mounted within the outer casing for receiving the at least one fastener.

32. The system as claimed in claim 27 wherein the card rack and outer casing are cast titanium.

33. The system as claimed in claim 27 wherein the card rack and outer casing are cast steel.

34. The system as claimed in claim 27 wherein the at least one outer case fastener is a bolt.

35. The system as claimed in claim 27 wherein the at least one outer case fastener comprises four bolts.

36. A structure for packing electronics exposed to a gun-launched environment comprising:
a card rack comprising:
a base portion having an upper side, a lower side, an edge and a center axis;
a wall portion extending from the base portion and having a principal axis substantially aligned with the base center axis and substantially perpendicular to the upper side of the base, wherein the wall portion has an inward side facing the principal axis, an outward side facing away from the principal axis and a top edge;
and a plurality of panel portions, each of the plurality of panel portions extending from the base portion and having a top side, a negative rotation facing side, a positive rotation facing side and an outer edge, each of the top sides of the plurality of panel portions oriented radially from the principal axis of the wall portion and thereby extending outwardly from the outward side of the wall portion;
and a plurality of mounting sectors wherein any two adjacent panel portions of the plurality of radially oriented panel portions, an interstitial sector of the upper side of the base, and an interstitial portion of the outward side of the wall portion form a mounting sector;
at least one circuit card assembly having a top edge, the at least one circuit card mechanically inserted into a respective mounting sector of the plurality of mounting sectors of the card rack; and
a circuit interconnect member in electrical communication with the inserted at least one circuit card assembly, the circuit interconnect member mounted to the top side of each of the plurality of panels;
at least one outer case fastener; and
an outer casing, having a plurality of internal ribs aligned with the plurality of panels of the card rack, the outer casing fastened to the card rack with at least one outer case fastener.

37. The structure as claimed in claim 36 wherein the base portion has a disc shape.

38. The structure as claimed in claim 36 wherein the wall portion is substantially cylindrical.

39. The structure as claimed in claim 36 wherein the outer casing is welded to the card rack.

40. The structure as claimed in claim 36 wherein the outer casing is a shell casing.

41. The structure as claimed in claim 36 wherein the outer casing is a shell casing in the shape of a frustro-conical section.

42. The structure claimed in claim 36 further comprising at least one alignment bushing, positioned within the outer casing, for receiving the at least one outer case fastener.

43. The structure as claimed in claim 36 wherein the card rack and outer casing are cast titanium.

44. The structure as claimed in claim 36 wherein the card rack and outer casing are cast steel.

45. The structure as claimed in claim 36 wherein the least one outer case fastener is a bolt.

46. The structure as claimed in claim 36 wherein the least one outer case fastener comprises four bolts.

47. A method of packing electronics exposed to a gun-launched environment, the method comprising:
fabricating a card rack comprising:
a base portion having an upper side, a lower side, an edge and a center axis;
a wall portion extending from the base portion and having a principal axis substantially aligned with the base center axis and substantially perpendicular to the upper side of the base, wherein the wall portion has an inward side facing the principal axis, an outward side facing away from the principal axis and a top edge;
and a plurality of panel portions, each of the plurality of panel portions extending from the base portion and having a top side, a negative rotation facing side, a positive rotation facing side and an outer edge, each of the top sides of the plurality of panel portions oriented radially from the principal axis of the wall portion and thereby extending outwardly from the outward side of the wall portion;
and a plurality of mounting sectors wherein any two adjacent panel portions of the plurality of radially oriented panel portions, an interstitial sector of the upper side of the base, and an interstitial portion of the outward side of the wall portion form a mounting sector;
fabricating at least one circuit card assembly;
inserting the at least one circuit assembly into a mounting sector of the plurality of mounting sectors of the card rack;
fabricating a circuit interconnect member;
mounting the circuit interconnect member to the top side of each of the plurality of panel portions with the circuit interconnect member in electrical communication with the at least one circuit card assembly,
whereby a gun-hardened electronics system is made.

48. The method as claimed in claim 47 wherein after inserting the at least one circuit assembly further comprises bonding the at least one circuit assembly to the card rack.

49. The method as claimed in claim 47 wherein after inserting the at least one circuit assembly further comprises bonding a first card to a negative rotation facing side of a panel portion and bonding a second card to a positive rotation facing side of an adjacent panel portion, wherein the first card and second card are interconnected via flex ribbon.

50. The method as claimed in claim 49 wherein after bonding the first card and the second card further comprises bonding a third card to the interstitial sector of the upper side of the base, wherein the third card is interconnected via a flex ribbon to the second card.

51. The method as claimed in claim 49 wherein after bonding the first card and the second card further comprises bonding a third card to the interstitial sector of the upper side of the base, wherein the third card is interconnected via a flex ribbon to the first card.

52. The method as claimed in claim 47 wherein the base portion has a disc shape.

53. The method as claimed in claim 47 wherein the wall portion is substantially cylindrical.

54. The method as claimed in claim 47 wherein the circuit interconnect member has a disc shape.

55. The method as claimed in claim 47 wherein each of the at least one circuit card assembly has a plurality of connector pins.

56. The method as claimed in claim 47 wherein the circuit interconnect member has a plurality of apertures in at least one radial linear array for receiving the polarity of circuit card connector pins.

57. The method as claimed in claim 47 wherein the at least one circuit card assembly comprises at least one multi-layer polyimide circuit card.

58. The method as claimed in claim 47 wherein the at least one circuit card assembly comprises a plurality of multi-layer polyimide circuit cards interconnected with flex ribbon.

59. The method as claimed in claim 47 wherein the at least one circuit card assembly comprises at least one multi-layer circuit card of epoxy laminates.

60. The method as claimed in claim 47 wherein the at least one circuit card assembly comprises a plurality of multi-layer circuit cards of epoxy laminates interconnected with flex ribbon.

61. The method as claimed in claim 47 wherein the at least one circuit card assembly comprises at least one multi-layer ceramic circuit card.

62. The method as claimed in claim 47 wherein the at least one circuit card assembly comprises a plurality of multi-layer ceramic circuit cards interconnected with flex ribbon.

63. The method as claimed in claim 47 further comprising wave soldering the electrical interconnections of the gun-hardened electronics system.

64. The method as claimed in claim 47 further comprising establishing electrical interconnections of the gun-hardened electronics system with connectors.

65. The method as claimed in claim 47 further comprising:
aligning a plurality of internal ribs of an outer casing with the plurality of panel portions of the card rack, and fastening the outer casing to the card rack with at least one outer case fastener.

66. The method as claimed in claim 65 further comprising, following the fastening of the outer casing to the card rack with at least one outer case fastener,
welding the outer casing to the card rack.

67. The method as claimed in claim 65 wherein the outer casing is a shell casing.

68. The method as claimed in claim 65 wherein the outer casing is a shell casing in the shape of a frustro-conical section.

69. The method claimed in claim 65 further comprising, preceding the fastening of the outer casing to the card rack with at least one outer case fastener, providing at least one alignment bushing, positioned within the outer casing, for receiving the at least one outer case fastener.

70. The method as claimed in claim 65 wherein the card rack and outer casing are cast titanium.

71. The method as claimed in claim 65 wherein the card rack and outer casing are cast steel.

72. The method as claimed in claim 65 wherein the at least one outer case fastener is a bolt.

73. The method as claimed in claim 65 wherein the at least one outer case fastener comprises four bolts.

74. The method as claimed in claim 47 further comprising the step, preceding the step of mounting the circuit interconnect member, of mounting a stabilizing member to the top side of each of the plurality of panels for mechanically stabilizing the inserted at least one circuit card assembly and thereafter mounting the circuit interconnect member to the stabilizing member.

75. The method as claimed in claim 74 wherein the stabilizing member has a disc shape.

* * * * *

UNITED STATES PATENT AND TRADEMARK OFFICE
CERTIFICATE OF CORRECTION

PATENT NO. : 6,744,637 B2
APPLICATION NO. : 10/307127
DATED : June 1, 2004
INVENTOR(S) : Ernest Steven Blazic, Kent Carl Nelson and Farhad James Nekoogar It is certified that error appears in the above-identified patent and that said Letters Patent is hereby corrected as shown below:

In the drawings:
In FIG. 10, delete reference numeral "910" appearing just above the figure.

Delete drawing sheet 5 and substitute the attached Sheet 5 therefor.

In the specification:

| | | |
|---|---|---|
| COLUMN 1, | LINE 22, | change "thousands times" to --thousand times-- |
| COLUMN 1, | LINE 35, | change "the circuits" to --the circuit-- |
| COLUMN 1, | LINES 47-48, | change "resulting irregular," to --resulting in irregular,-- |
| COLUMN 2, | LINE 15, | change "mm canon" to --mm cannon-- |
| COLUMN 3, | LINE 60, | change "within 5 cm×8 cm×1 cm envelope." to --within a 5 cm × 8 cm × 1 cm envelope.-- |
| COLUMN 4, | LINE 62, | change "hub aperture 440" to --cylindrical portion 440-- |
| COLUMN 5, | LINE 49, | change "The Example" to --In the Example-- |
| COLUMN 5, | LINE 50, | change "outer shell are" to --outer shell 900 are-- |
| COLUMN 5, | LINE 62, | change "circuit assemblies 200" to --circuit card assemblies 200-- |
| COLUMN 5, | LINE 65, | change "circuitry 200" to --circuit card assembly 200-- |

In the claims:

| | | | |
|---|---|---|---|
| CLAIM 1, | COLUMN 7, | LINE 63, | change "at least one circuit card mechanically" to --at least one circuit card assembly mechanically-- |
| CLAIM 2, | COLUMN 8, | LINE 4, | change "circuit assembly" to --circuit card assembly-- |
| CLAIM 3, | COLUMN 8, | LINE 6, | change "circuit assembly" to --circuit card assembly-- |
| CLAIM 4, | COLUMN 8, | LINE 12, | change "circuit assembly" to --circuit card assembly-- |
| CLAIM 5, | COLUMN 8, | LINE 18, | change "circuit assembly" to --circuit card assembly-- |

UNITED STATES PATENT AND TRADEMARK OFFICE
CERTIFICATE OF CORRECTION

PATENT NO.         : 6,744,637 B2
APPLICATION NO. : 10/307127
DATED                  : June 1, 2004
INVENTOR(S)       : Ernest Steven Blazic, Kent Carl Nelson and Farhad James Nekoogar It is certified that error appears in the above-identified patent and that said Letters Patent is hereby corrected as shown below:

| | |
|---|---|
| CLAIM 47, COLUMN 10, LINE 56, | change "circuit assembly" to --circuit card assembly-- |
| CLAIM 48, COLUMN 10, LINE 66, | change "circuit assembly" to --circuit card assembly-- |
| CLAIM 48, COLUMN 10, LINE 67, | change "circuit assembly" to --circuit card assembly-- |
| CLAIM 69, COLUMN 12, LINE 24, | change "The method claimed" to --The method as claimed -- |

UNITED STATES PATENT AND TRADEMARK OFFICE
CERTIFICATE OF CORRECTION

PATENT NO. : 6,744,637 B2
APPLICATION NO. : 10/307127
DATED : June 1, 2004
INVENTOR(S) : Ernest Steven Blazic, Kent Carl Nelson and Farhad James Nekoogar It is certified that error appears in the above-identified patent and that said Letters Patent is hereby corrected as shown below:

Replace FIG. 10 with the following amended figure:

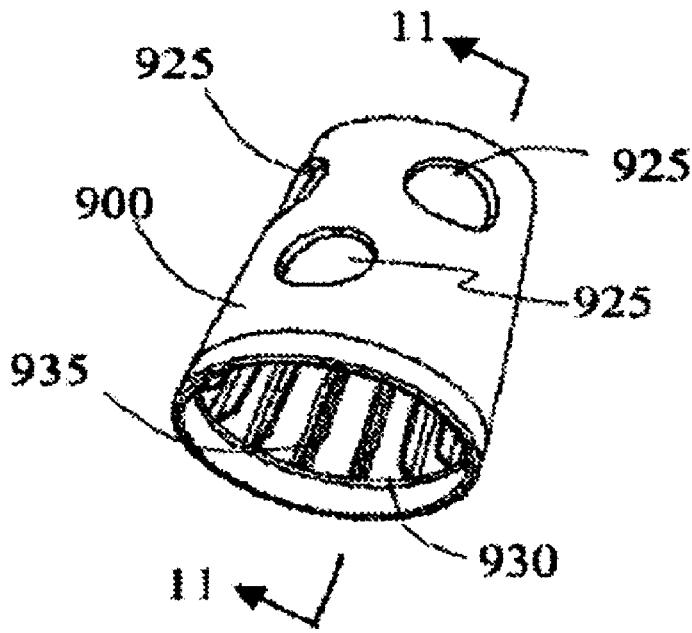

FIG. 10

Signed and Sealed this

Twenty-sixth Day of August, 2008

JON W. DUDAS
*Director of the United States Patent and Trademark Office*